US008497169B2

(12) United States Patent
Chang et al.

(10) Patent No.: US 8,497,169 B2
(45) Date of Patent: *Jul. 30, 2013

(54) METHOD FOR PROTECTING A GATE STRUCTURE DURING CONTACT FORMATION (75) Inventors: Hong-Dyi Chang, Taipei (TW); Pei-Chao Su, Zhudong Town (TW); Kong-Beng Thei, Pao-Shan Village (TW); Hun-Jan Tao, Hsinchu (TW); Harry Hak-Lay Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/475,245

(22) Filed: May 18, 2012

(65) Prior Publication Data
US 2012/0228679 A1   Sep. 13, 2012

Related U.S. Application Data (62) Division of application No. 12/428,011, filed on Apr. 22, 2009, now Pat. No. 8,202,776.

(51) Int. Cl.
*H01L 21/8238* (2006.01)

(52) U.S. Cl.
USPC ............................ 438/216; 438/287; 438/591

(58) Field of Classification Search
USPC .................................. 438/216, 287, 586, 591
See application file for complete search history.

(56) References Cited

U.S. PATENT DOCUMENTS

| | | | |
|---|---|---|---|
| 4,517,729 A | 5/1985 | Batra | |
| 5,872,063 A | 2/1999 | Chao et al. | |
| 6,645,818 B1 | 11/2003 | Sing et al. | |
| 8,202,776 B2 * | 6/2012 | Chang et al. | 438/216 |
| 2009/0181529 A1 | 7/2009 | Kang et al. | |
| 2009/0321795 A1 | 12/2009 | King et al. | |

* cited by examiner

*Primary Examiner* — Kevin M Picardat
(74) *Attorney, Agent, or Firm* — Haynes and Boone, LLP (57) ABSTRACT Various methods for protecting a gate structure during contact formation are disclosed. An exemplary method includes: forming a gate structure over a substrate, wherein the gate structure includes a gate and the gate structure interposes a source region and a drain region disposed in the substrate; patterning a first etch stop layer such that the first etch stop layer is disposed on the source region and the drain region; patterning a second etch stop layer such that the second etch stop layer is disposed on the gate structure; and forming a source contact, a drain contact, and a gate contact, wherein the source contact and the drain contact extend through the first etch stop layer and the gate contact extends through the second etch stop layer, wherein the forming the source contact, the drain contact, and the gate contact includes simultaneously removing the first etch stop layer and the second etch stop layer to expose the gate, source region, and drain region.

15 Claims, 8 Drawing Sheets

METHOD FOR PROTECTING A GATE STRUCTURE DURING CONTACT FORMATION

This application is a continuation of U.S. patent application Ser. No. 12/428,011, filed Apr. 22, 2009, issued as U.S. Pat. No. 8,202,776, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. Conventional IC processing involves forming one or more contacts to various features of an IC. For example, oftentimes, contact openings are simultaneously formed to areas of a substrate (or wafer) (e.g., doped regions) and gate structures disposed thereover. It has been observed that the traditional processes for forming contact openings to the substrate and gate structures may result in etching portions of the gate structure, such as the gate stack (e.g., a polysilicon and/or gate electrode). This over-etching of the gate structure can lead to undesirable contact resistance and degrade device performance.

Accordingly, what is needed is a method for manufacturing an integrated circuit device that addresses the above stated issues.

SUMMARY

A semiconductor device and method for manufacturing a semiconductor device is disclosed. In one embodiment, the method includes providing a substrate and forming at least one gate structure over the substrate and forming a plurality of doped regions in the substrate. The method further comprises forming an etch stop layer over the substrate; removing a first portion of the etch stop layer, wherein a second portion of the etch stop layer remains over the plurality of doped regions; forming a hard mask layer over the substrate; and removing a first portion of the hard mask layer, wherein a second portion of the hard mask layer remains over the at least one gate structure. The method can further comprise forming a first contact through the second portion of the hard mask layer to the at least one gate structure, and a second contact through the second portion of the etch stop layer to the plurality of doped regions.

In one embodiment, the method includes providing a substrate and forming at least one gate structure over the substrate, wherein the at least one gate structure comprises a dummy gate. The method further comprises forming an etch stop layer over the substrate, including over the at least one gate structure; forming a first interlevel dielectric (ILD) layer over the etch stop layer; and performing a chemical mechanical polishing (CMP) process on the first ILD and etch stop layer until a top portion of the at least one gate structure is exposed. The method can further comprise replacing the dummy gate of the at least one gate structure; forming a hard mask layer over the top portion of the at least one gate structure; forming a second ILD layer over the first ILD layer, including over the hard mask layer; and forming one or more contact openings to the at least one gate structure and to the substrate.

In one embodiment, the semiconductor device includes a substrate having at least one gate structure disposed thereover and a plurality of doped regions disposed therein; a hard mask layer disposed over the at least one gate structure; an etch stop layer disposed over the plurality of doped regiona; a dielectric layer disposed over the hard mask layer and etch stop layer; and one or more contacts, wherein at least one contact extends through the dielectric layer and the hard mask layer to the at least one gate structure, and wherein at least one contact extends through the dielectric layer and the etch stop layer to the plurality of doped regions.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to methods for manufacturing integrated circuit devices, and more particularly, to a method for manufacturing an integrated circuit device with improved device performance.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
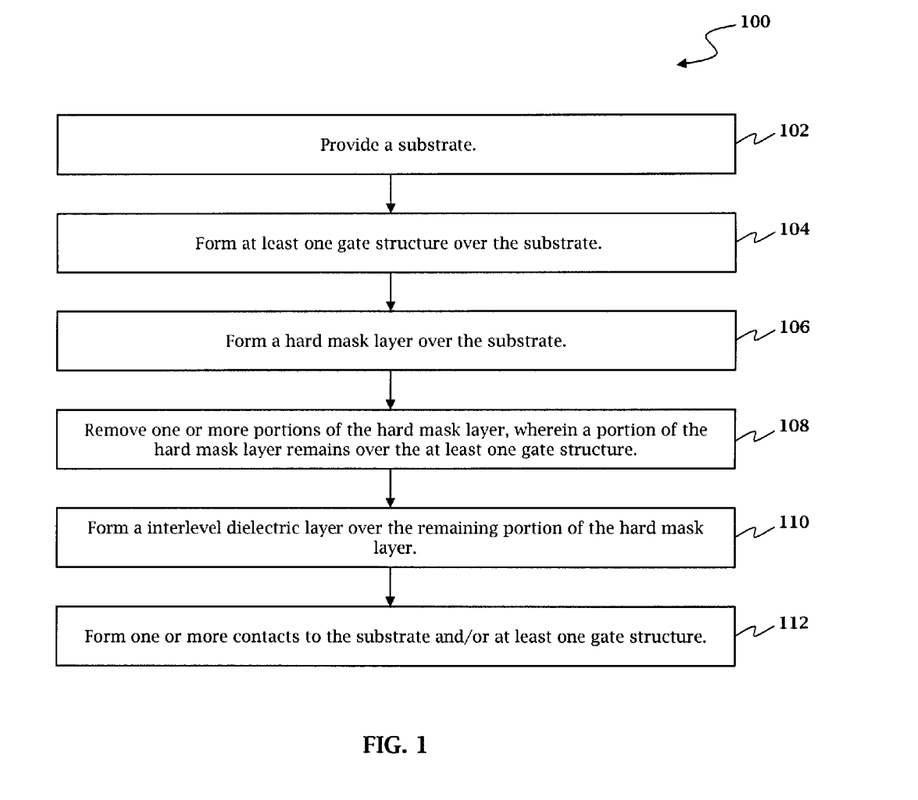
FIG. 1 is a flow chart of a method for fabricating an integrated circuit device according to aspects of the present embodiments.
Figure 2A:
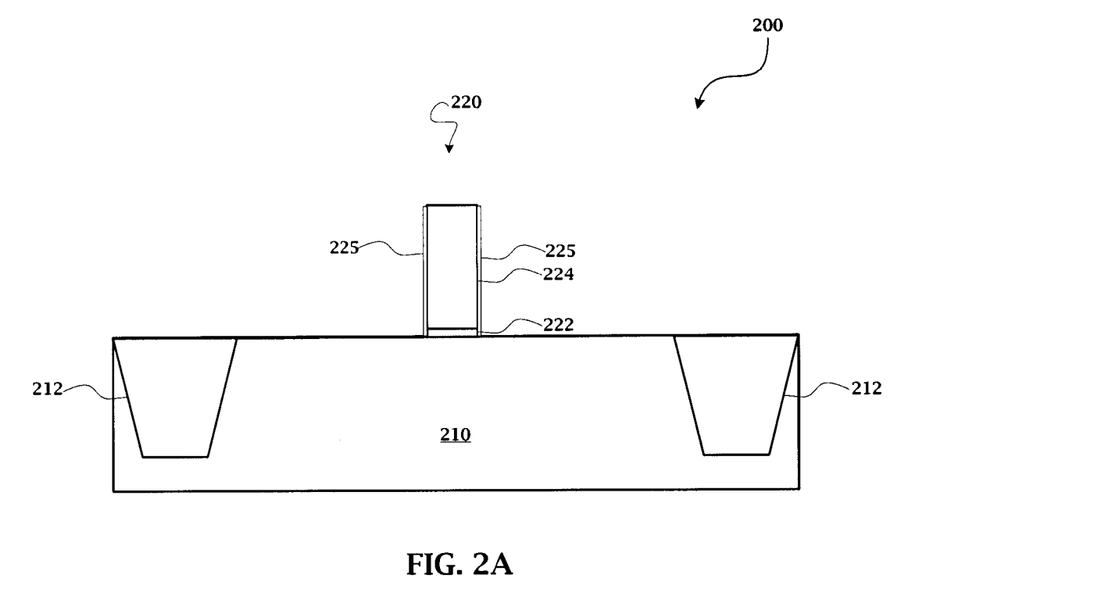
FIGS. 2A-2N are various cross-sectional views of embodiments of an integrated circuit device during various fabrication stages according to the method of FIG. 1.
Figure 2B:
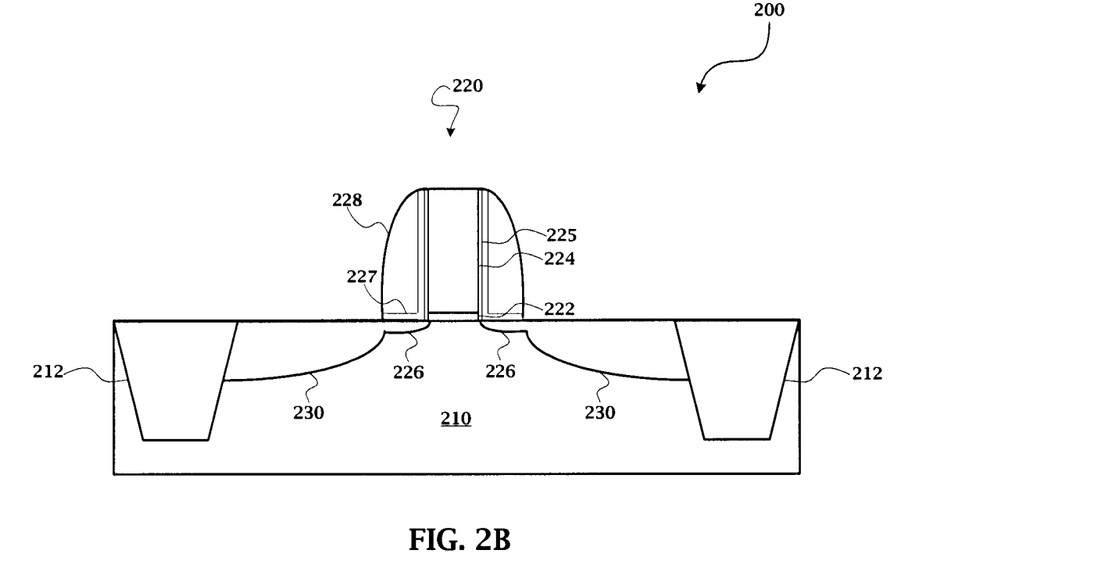
Figure 2C:
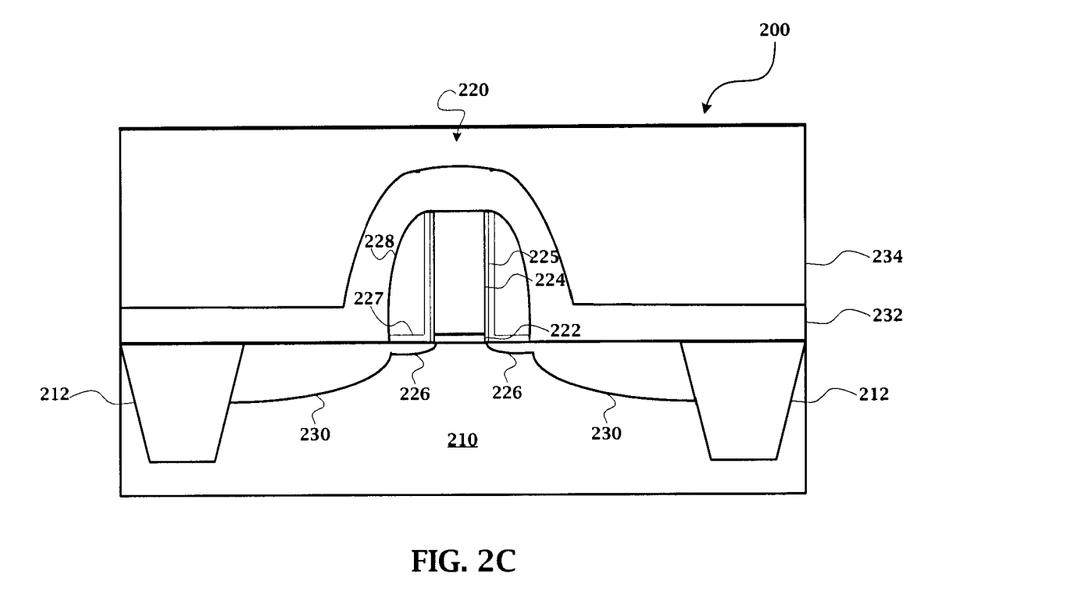
Figure 2D:
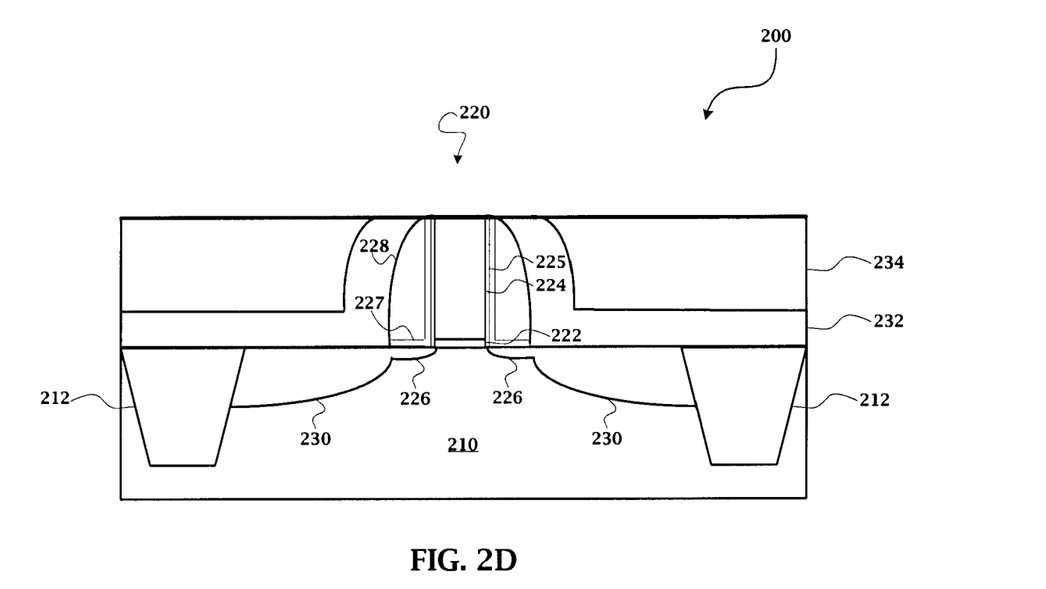
Figure 2E:
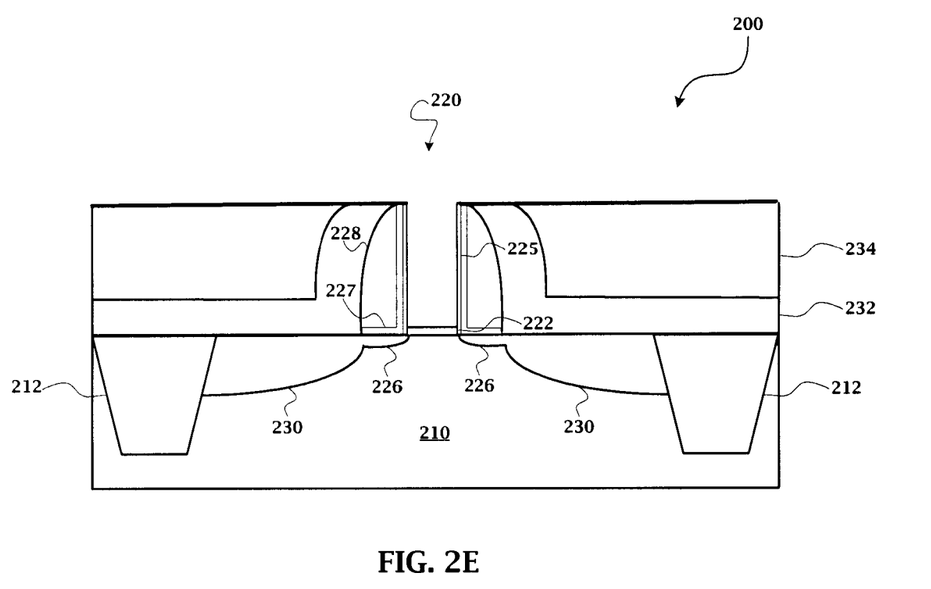
Figure 2F:
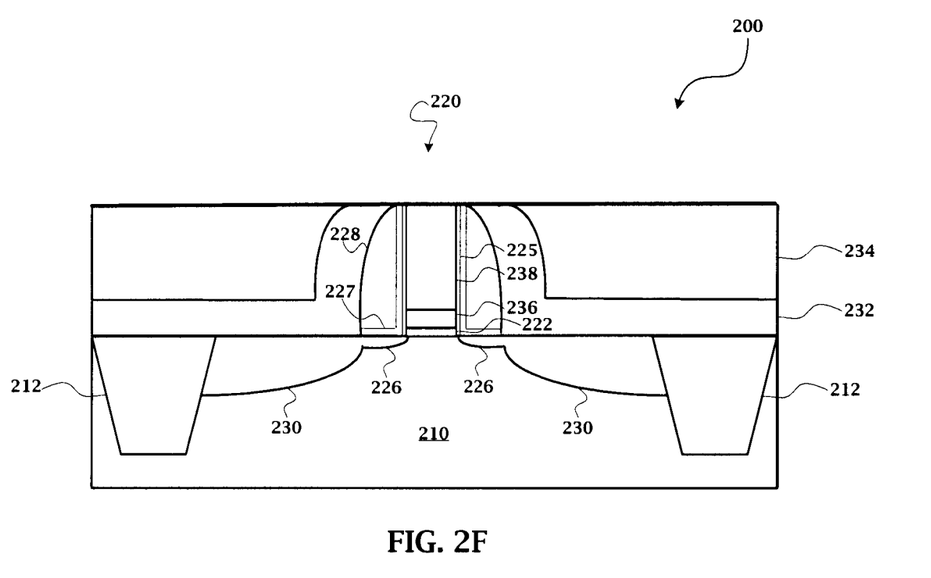
Figure 2G:
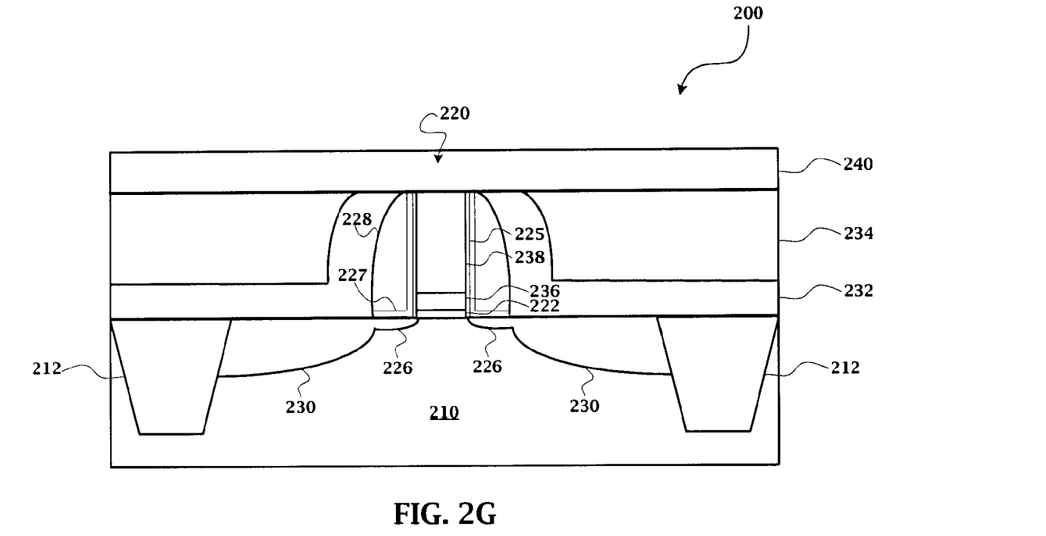
Figure 2H:
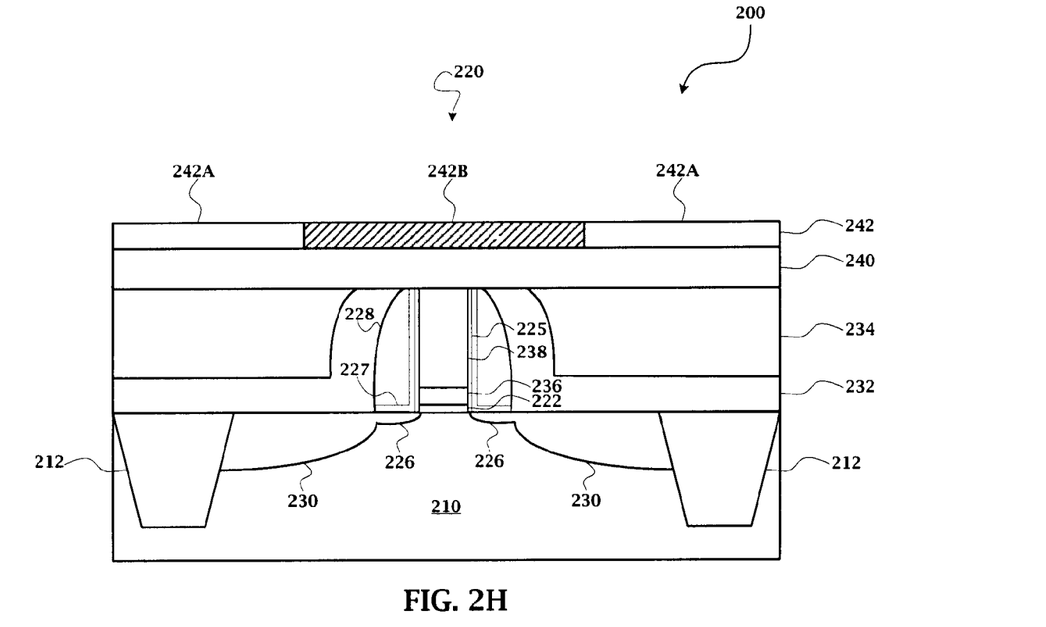
Figure 2I:
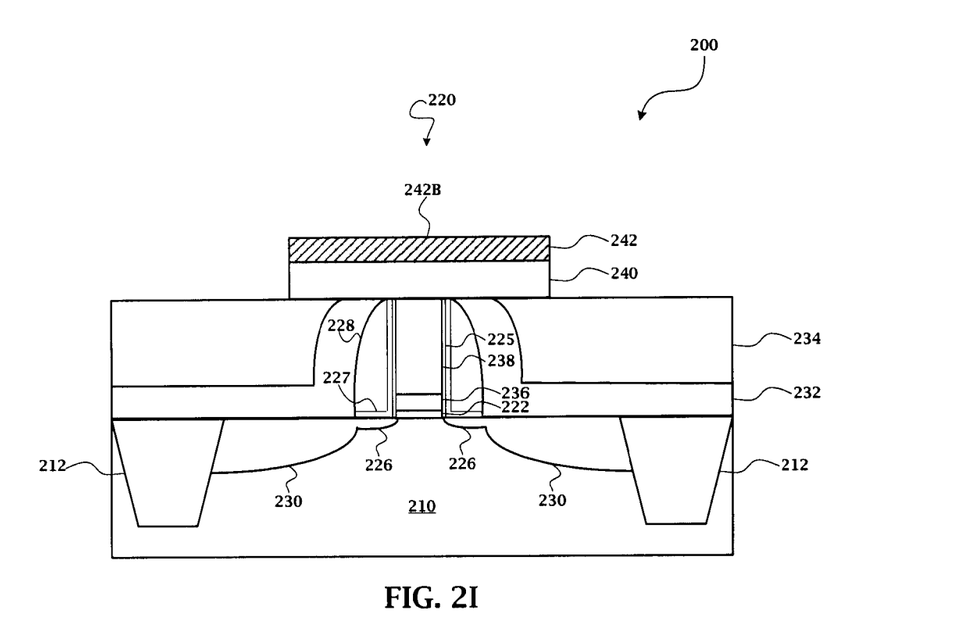
Figure 2J:
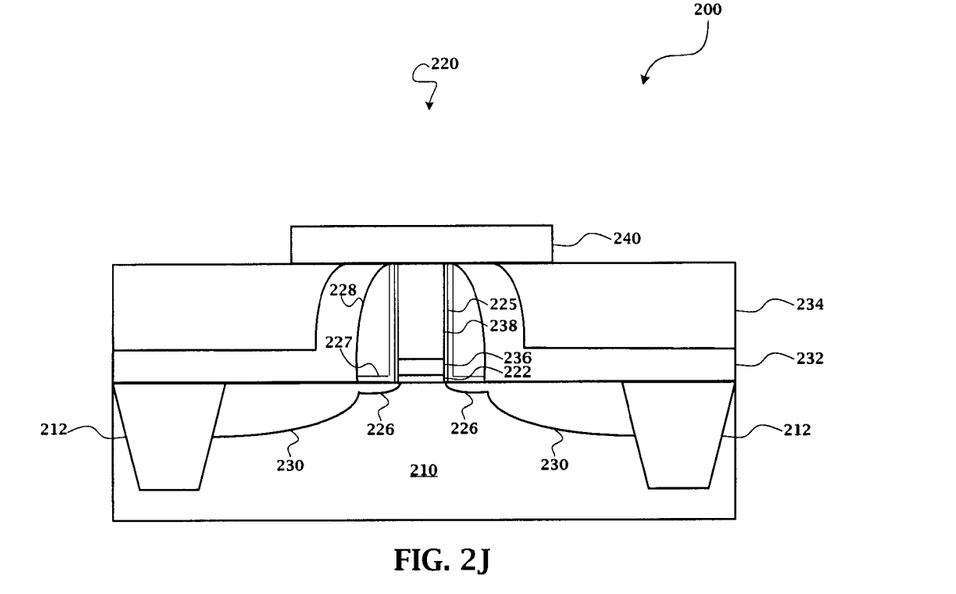
Figure 2K:
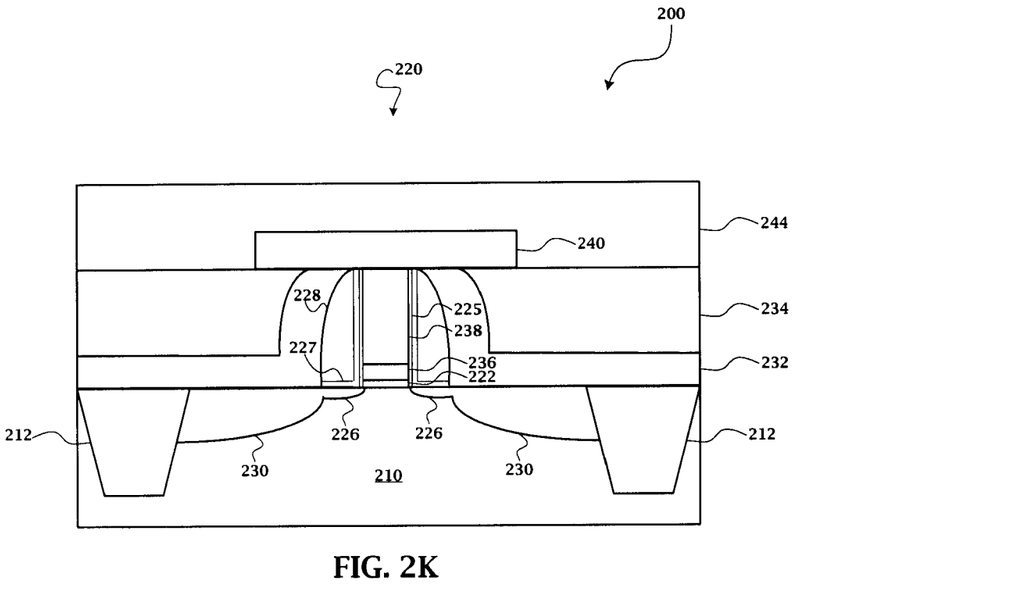
Figure 2L:
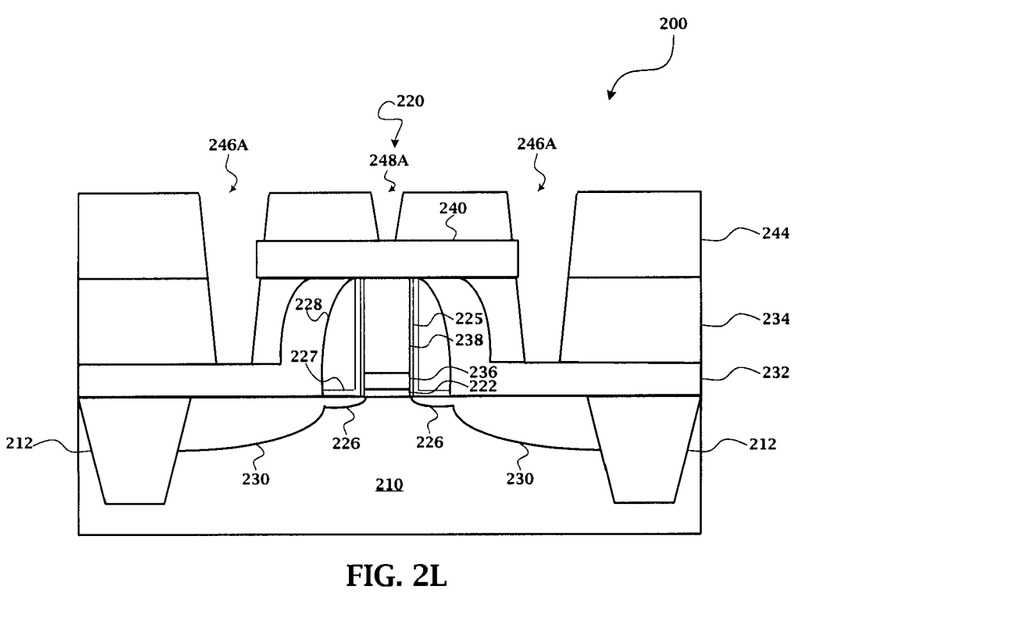
Figure 2M:
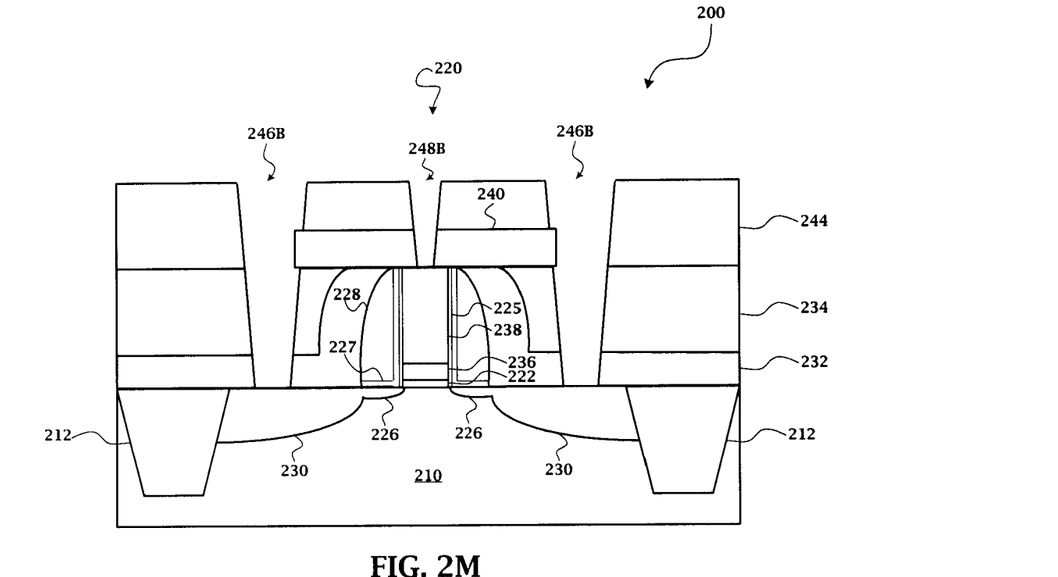
Figure 2N:
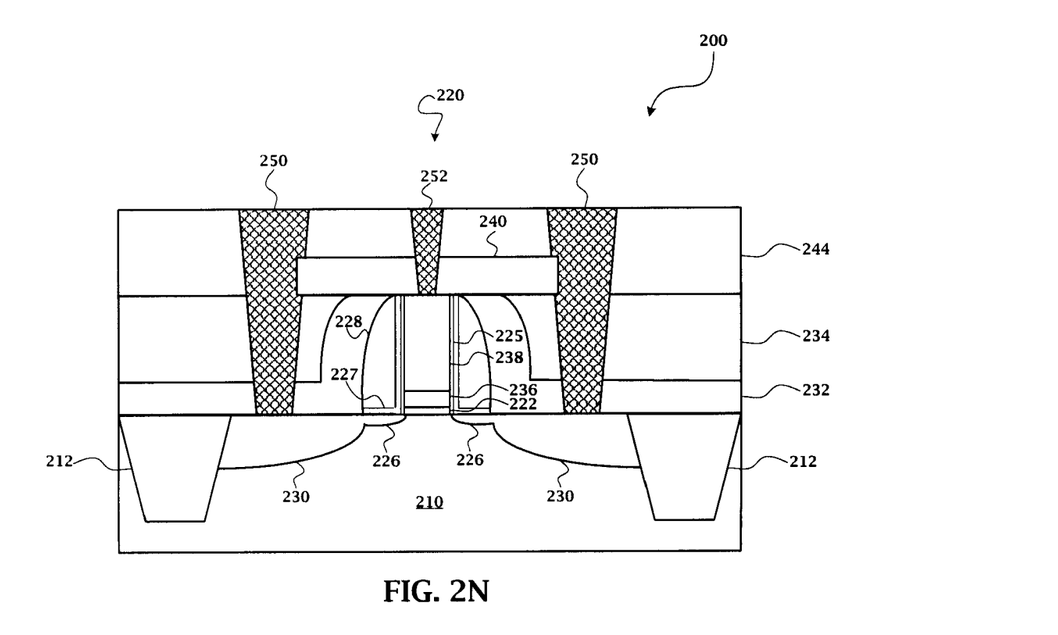

With reference to FIGS. 1 through 2N, a method 100 and a semiconductor device 200 are collectively described below. FIG. 1 is a flow chart of one embodiment of the method 100 for making the semiconductor device 200. FIGS. 2A-2N are various cross-sectional views of the semiconductor device 200 according to one embodiment, in portion or entirety, during various fabrication stages of the method 100. The semiconductor device 200 may be an integrated circuit, or portion thereof, that may comprise static random access memory (SRAM), memory cells, and/or logic circuits; passive components such as resistors, capacitors, inductors, and/or fuses; active components, such as P-channel field effect transistors (PFETs), N-channel field effect transistors (NFETs), metal-oxide-semiconductor field effect transistors (MOSFETs), complementary metal-oxide-semiconductor transistors (CMOSs), bipolar transistors, high voltage transistors, and/or high frequency transistors; other suitable components; and/or combinations thereof. It is understood that additional steps can be provided before, during, and after the method 100, and some of the steps described below can be replaced or eliminated, for additional embodiments of the method 100. It is further understood that additional features can be added in the semiconductor device 200, and some of the features described below can be replaced or eliminated, for additional embodiments of the semiconductor device 200.

The semiconductor device 200 may be fabricated in a gate first process, gate last process, or hybrid process including a gate first process and a gate last process. In the gate first process, a metal gate structure may be formed first and may be followed by a CMOS process flow to fabricate the final device. In the gate last process, a dummy poly gate structure may be formed first and may be followed by a normal CMOS process flow until deposition of an interlayer dielectric (ILD), and then the dummy poly gate structure may be removed and replaced with a metal gate structure. In the hybrid gate process, a metal gate structure of one type of device may be formed first and a metal gate structure of another type of device may be formed last.

Referring to FIGS. 1 and 2A, the method 100 begins at step 102 wherein a substrate 210 including at least one isolation region 212 is provided. In the present embodiment, the substrate 210 is a semiconductor substrate. The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In some embodiments, the substrate 210 may comprise a non-semiconductor material, such as glass.

The substrate 210 may include various doping configurations depending on design requirements as known in the art. In some embodiments, the substrate 210 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by complementary metal-oxide-semiconductor (CMOS) technology processing, and thus some processes are not described in detail herein.

The at least one isolation region 212 may be formed on the substrate 210 to isolate various regions, for example, to isolate NMOS and PMOS transistor device regions. The isolation region 212 may utilize isolation technology, such as local oxidation of silicon (LOCOS) or shallow trench isolation (STI), to define and electrically isolate the various regions. In the present embodiment, the isolation region 212 includes a STI. The isolation region 212 may comprise silicon oxide, silicon nitride, silicon oxynitride, fluoride-doped silicate glass (FSG), a low-K dielectric material, other suitable materials, and/or combinations thereof. The isolation region 212, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Referring to FIGS. 1 and 2A-2B, at step 104, at least one gate structure 220 is formed over the substrate 210. The gate structure 220 may be formed by any suitable process. For example, the gate structure 220 may be formed by conventional deposition, photolithography patterning, and etching processes, and/or combinations thereof. The deposition processes may include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), epitaxial growth methods (e.g., selective epitaxy growth), sputtering, plating, spin-on coating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and/or molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the at least one gate structure may be formed by any combination of the processes described herein.

In the present embodiment, referring to FIG. 2A, a gate stack comprising a high-k dielectric layer 222 and a dummy gate layer 224 is formed. The high-k dielectric layer 222 is formed over the substrate 210. The high-k dielectric layer 222 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof.

In the present embodiment, the dummy gate layer 224 comprises polycrystalline silicon. The gate stack may be formed by any suitable process, including the processes described herein. In one example, the high-k dielectric layer 222 and dummy gate layer 224 are deposited over the substrate 210. Then, a layer of photoresist is formed over the dummy gate layer 224 by a suitable process, such as spin-on coating, and patterned to form a patterned photoresist feature by a proper lithography patterning method. Antireflective coating layers (e.g., a top antireflective coating layer and/or a bottom antireflective coating layer) may be formed adjacent the layer of photoresist. The pattern of the photoresist can then be transferred by a dry etching process to the underlying layers (i.e., the high-k dielectric layer 222 and the dummy gate layer 224) to form the gate stack as shown in FIG. 2A. The photoresist layer may be stripped thereafter. In another example, a hard mask layer is formed over the dummy gate layer 224; a patterned photoresist layer is formed on the hard mask layer; the pattern of the photoresist layer is transferred to the hard mask layer and then transferred to the dummy gate layer 224 and the high-k dielectric layer 222 to form the gate stack of the gate structure 220. It is understood that the above examples do not limit the processing steps that may be utilized to form the gate stack 220. It is further understood that the gate stack of the gate structure 220 may comprise additional layers. For example, the gate stack may additionally include an interfacial layer, such as silicon oxide, interposed between the substrate 210 and the high-k dielectric layer 222. In another embodiment, the gate stack may comprise a capping layer interposed between the dummy gate layer 224 and the high-k dielectric layer 222.

A sealing layer 225 is formed on the sidewalls of the gate stack of the gate structure 220. In the present embodiment, the sealing layer 225 is formed on the sidewalls of the high-k dielectric layer 222 and dummy gate layer 224. The sealing layer 225 may include a dielectric material, such as silicon nitride, silicon oxide, silicon oxynitride, other suitable material, and/or combinations thereof. The sealing layer 225 may include a single layer or multiple layer configuration. It should be noted that the sealing layer 225 may protect the gate stack of the gate structure 220 from damage or loss during subsequent processing, and may also prevent oxidation during subsequent processing. The sealing layer 225 is formed by any suitable process to any suitable thickness, including the processes described herein.

Referring to FIG. 2B, lightly doped source/drain (LDD) regions 226 are formed. The LDD regions 226 may be formed in the substrate 210 by one or more implantation processes, such as an ion implantation process. The doping species may depend on the type of device being fabricated, such as an NMOS or PMOS device. For example, the LDD regions 226 may be doped with p-type dopants, such as boron or $BF_2$; n-type dopants, such as phosphorus or arsenic; and/or combinations thereof. The LDD regions 226 may comprise various doping profiles. The LDD regions 226 may be aligned with an outer edge of the sealing layer 225 following the ion implantation process. As previously noted, the sealing layer 225 may provide protection to prevent contamination or damage to the gate stack comprising the high-k dielectric layer 222 and dummy gate layer 224 during subsequent processing. Thus, the integrity of the gate structure 220 may be maintained which may result in better device performance and reliability. Additionally, it should be noted that during a subsequent annealing process (e.g., activation process) the dopants in the LDD regions 226 may diffuse towards the sidewalls of the gate stack comprising the high-k dielectric layer 222 and dummy gate layer 224 such that a portion of each of the LDD regions 226 may extend underneath a portion of the sealing layer 225.

Following formation of the LDD regions 226, conventional spacer liner 227, gate spacers 228, and S/D regions 230 are formed. The spacer liner 227 and gate spacers 228 are formed by any suitable process to any suitable thickness, including the processes described herein. In the present embodiment, the spacer liner 227 comprise an oxide material (e.g., silicon oxide), and the gate spacers 228, which are positioned on each side of the gate structure 220, comprise a nitride material (e.g., silicon nitride). The gate spacers 228 may comprise a dielectric material such as silicon nitride, silicon oxide, silicon carbide, silicon oxynitride, other suitable materials, and/or combinations thereof. The spacer liner 227 and/or gate spacers 228 may comprise a multilayer structure. The gate spacers 228 may be used to offset the S/D regions 230 (also referred to as heavily doped source/drain regions). The S/D regions 230 may be formed in the substrate 210 by one or more implantation processes, such as an ion implantation process. The doping species may depend on the type of device being fabricated, such as an NMOS or PMOS device. For example, the S/D regions 230 may doped with p-type dopants, such as boron or $BF_2$; n-type dopants, such as phosphorus or arsenic; and/or combinations thereof. The S/D regions 230 may comprise various doping profiles, and the S/D regions 230 may be aligned with an outer edge of the spacers 228 following the ion implantation process. The S/D regions 230 may further include raised S/D regions in some embodiments. Also, one or more contact features (e.g., silicide regions) may be formed on the S/D regions 230 by a salicidation (or self-aligned silicidation) process.

Referring to FIG. 2C, an etch stop layer (ESL) 232 and interlayer (or inter-level) dielectric (ILD) layer 234 may be formed over the semiconductor device 200, including over the at least one gate structure, by any suitable process, such as CVD. The ESL 232 may include silicon nitride, silicon oxynitride, amorphous carbon material, silicon carbide and/or other suitable materials. The ESL 232 composition may be selected based upon etching selectivity to one or more additional features of the semiconductor device 200. In the present embodiment, the ESL 232 is a contact etch stop layer (CESL) comprising silicon nitride. ESL 232 further comprises any suitable thickness. In the present embodiment, ESL 232 comprises a thickness of about 200 Å.

The ILD layer 234 comprises a dielectric material. The dielectric material may comprise silicon oxide, silicon nitride, silicon oxynitride, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, non-porous materials, porous materials, and/or combinations thereof. In some embodiments, the ILD layer 234 may include a high density plasma (HDP) dielectric material (e.g., HDP oxide) and/or a high aspect ratio process (HARP) dielectric material (e.g., HARP oxide). The ILD layer 234 comprises any suitable thickness. In the present embodiment, ILD layer 234 comprises a thickness of about 4500 Å. It is understood that the ILD layer 234 may comprise one or more dielectric materials and/or one or more dielectric layers.

Subsequently, the ESL 232 and/or ILD layer 234 are planarized by a chemical mechanical polishing (CMP) process until a top portion of the at least one gate structure 220 overlying the semiconductor substrate 210 is exposed as illustrated in FIG. 2D. The CMP process may have a high selectivity to provide a substantially planar surface for the gate structure 220, ESL 232, and ILD layer 234. The CMP process may also have low dishing and/or metal erosion effect.

Referring to FIG. 2E and FIG. 2F, a gate replacement process is performed. The dummy gate layer 224 is removed and replaced by a metal gate. For example, in the present embodiment, the dummy gate layer 224 is replaced by a work function layer 236 and a gate layer 238. The dummy gate layer 224 is removed to form a trench (or recess) in the gate structure 220 by any suitable process, including the processes described herein. The work function layer 236 and gate layer 238 may then be formed in the trench (or recess) of the gate structure 220. The work function layer 236 is formed over the high-k dielectric layer 222. The work function layer 236 is tuned to have a proper work function and comprises any suitable material. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some embodiments, the work function layer 236 may include doped-conducting metal oxide materials. The gate layer 238 comprises a conductive material, such as aluminum, copper, tungsten, titanium, tantulum, titanium nitride, tantalum nitride, nickel silicide, cobalt silicide, TaC, TaSiN, TaCN, TiAl, TiAlN, other suitable materials, and/or combinations thereof. Further, the gate layer 238 may be doped polycrystalline silicon with the same or different doping. In the present embodiment, the gate layer 238 comprises aluminum. It is understood that additional layers may be formed above and/or below the work function layer 236 and/or gate layer 238, including liner layers, interface layers, seed layers, adhesion layers, barrier layers, etc. It is further understood that the work function layer 236 and gate layer 238 may comprise one or more materials and/or one or more layers. The work function layer 236 and gate layer 238 may be formed by any suitable process to any suitable thickness, including the processes described herein.

Subsequent to the formation of the work function layer 236 and gate layer 238, a CMP process may be performed to provide a substantially coplanar surface of the gate layer 238 (e.g., aluminum gate layer) of the gate structure 220. Conventional processing would continue to form an ILD layer over the semiconductor device 200, including over the gate structure; etch one or more contact openings to the S/D regions and/or the gate structure; and then, fill the one or more contact openings with a conductive material. It has been observed that formation of the one or more contact openings may undesirably etch portions of the gate stack (e.g., the gate layer). This can result since it takes longer to etch to the S/D regions than the gate stack. Thus, because the gate stack lacks protection, a top portion of the gate stack is exposed prior to a top portion of the S/D regions, which leads to portions of the gate stack being etched away. Such etching-through of the gate stack can lead to higher than desirable contact resistance, which may negatively affect overall device performance. Accordingly, in the present embodiment, a protective layer is formed over the gate structure. The protective layer may prevent the etching-through issue arising from the continued etching utilized to form contact openings to the S/D regions.

Referring to FIGS. 1 and 2G, at step 106, a hard mask (or protective) layer 240 is formed over the semiconductor device 200. More specifically, the hard mask layer 240 is formed over the ILD layer 234, including over the gate structure 220. In the present embodiment, the hard mask layer 240 comprises silicon nitride. The hard mask layer 240 may include a silicon oxynitride, amorphous carbon material, silicon carbide, other suitable nitrogen-containing materials, other suitable dielectric materials, and/or combinations thereof. The hard mask layer 240 may be formed by any suitable process, such as CVD. The hard mask layer 240 may include a single layer or multiple layers. Further, the hard mask layer 240 comprises any suitable thickness. In some embodiments, the hard mask layer 240 and the ESL 232 comprise substantially a same thickness. For example, in the present embodiment, the hard mask layer 240 comprises a thickness of about 200 Å.

At step 108, one or more portions of the hard mask layer are removed, wherein a portion of the hard mask layer remains over the at least one gate structure. The one or more portions of the hard mask layer 240 are removed by any suitable process, including the processes described herein. In the present embodiment, a photoresist layer 242 is formed over the hard mask layer 240 to any suitable thickness. Then, the photoresist layer 242 is patterned by a conventional photolithography process and/or processes to create one or more first portions 242A and one or more second portions 242B as shown in FIG. 2H. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and/or molecular imprint. Further, in some embodiments, the photolithography patterning and exposing process may implement krypton fluoride (KrF) excimer lasers, argon fluoride (ArF) excimer lasers, immersion lithography, extreme ultra-violet (EUV) radiation, and/or combinations thereof. It is understood that additional layers may be formed above or below the photoresist layer 242, such as one or more antireflective coating layers.

The patterned photoresist layer 242 comprising first and second portions 242A, 242B define unprotected and protected portions of the hard mask layer 240. The first portions 242A define unprotected portions of the hard mask layer 240. The second portions 242B define protected portions of the hard mask layer 240. The second portions 242B pattern and define portions of the hard mask layer 240 that will remain over the at least one gate structure 220. Referring to FIG. 2I, the first portions 242A of the photoresist layer 242 and the unprotected portions of the hard mask layer 240, which underlie the first portions 242A, are removed. The first portions 242A and unprotected portions of the hard mask layer 240 are removed by any suitable process. It is understood that the first portions 242A and unprotected portions of the hard mask layer 240 may be simultaneously or independently removed. For example, removing such portions may include an etching process. The etching process may include multiple etching steps and etching solutions to remove the first portions 242A and/or unprotected portions of the hard mask layer 240. The etching process may comprise one or more dry etching processes, wet etching processes, other suitable etching methods (e.g., reactive ion etching), and/or combinations thereof.

Subsequently, the photoresist layer 242 (i.e., second portions 242B) may be removed by any suitable process, such as a photoresist stripping process. Referring to FIG. 2J, the protected portions of the hard mask layer 240, which were underlying second portions 242B, remain over the substrate 210. In the present embodiment, the hard mask layer 240 remains extending over the entirety of the gate structure 220. It is understood that the remaining hard mask layer 240 may extend any suitable distance (for example, the hard mask layer 240 may extend over only the gate stack of the gate structure 220). It is further understood that the process utilized to pattern the hard mask layer 240 is not limited to the example described herein. For example, in some embodiments, a photoresist layer 242 may not be deposited over the hard mask layer 240, and the hard mask layer 240 may be patterned by a conventional lithography process, such as utilizing a mask (e.g., a mask utilized to pattern the gate stack).

Referring to FIGS. 1 and 2K, at step 110, an ILD layer 244 is formed over the semiconductor device 200. In the present embodiment, the ILD layer 244 is formed over the hard mask layer 240. The ILD layer 244 comprises a dielectric material, such as silicon oxide, silicon nitride, silicon oxynitride, SOG, FSG, carbon doped silicon oxide (e.g., SiCOH), Black Diamond® (Applied Materials of Santa Clara, Calif.), Xerogel, Aerogel, amorphous fluorinated carbon, Parylene, BCB, Flare, SiLK (Dow Chemical, Midland, Mich.), polyimide, non-porous materials, porous materials, other suitable dielectric materials, and/or combinations thereof. In some embodiments, the ILD layer 244 may include a HDP oxide and/or a HARP oxide. The ILD layer 244 comprises any suitable thickness. The ILD layer 244 may comprise one or more dielectric materials and/or one or more dielectric layers. Subsequently, the ILD layer 244 may be planarized by a CMP process.

Referring to FIG. 1 and FIGS. 2L-2N, at step 112, one or more contacts are formed to the substrate and/or at least one gate structure. In the present embodiment, one or more contacts are formed to the S/D regions 230 and the gate structure 220. Forming the one or more contacts comprises performing a first etching process and a second etching process. The first etching process is performed on the semiconductor device 200 to remove a portion of the ILD layers 234, 244. In the present embodiment, the first etching process is performed on the ILD layers 234, 244 until the ESL layer 232 over the S/D regions 230 and the hard mask layer 240 over the gate structure 220 is reached and/or exposed as illustrated in FIG. 2L. The removed portions of ILD layers 234, 244 form first contact openings and/or trenches 246A, 248A to the S/D regions 230 and gate structure 220. The first (or main) etching process has an etching selectivity between the ESL 232/hard mask layer 240 and the ILD layers 234, 244. Accordingly, the first etching process may stop at the ESL 232/hard mask layer 240. For example, with the ESL 232/hard mask layer 240 comprising silicon nitride and the ILD layers 234, 244 comprising oxide, the first etching process may exhibit a high etching selectivity between silicon nitride and oxide, such that the first etching process removes ILD layers 234, 244 without substantially affecting the ESL 232/hard mask layer 240.

As is evident from FIG. 2L and as noted above, in conventional processing, a top portion of the gate structure 220 will be reached before a top portion of the S/D regions 230 when forming contact openings. This often results in the undesirable etching of the gate structure 220. In the present embodiment, the hard mask layer 240 can protect the gate structure 220, particularly the gate layer 238 of the gate structure 220, while the first etching process forms contact openings to the ESL 232. The hard mask layer 240 may function as an etch stop layer for the first etching process. Thus, etching portions of the gate structure 220, such as the gate layer 238, is prevented. Such prevention may provide improved device performance by reducing the contact resistance arising at the gate structure.

The second etching process is performed on the semiconductor device 200 to remove a portion of the ESL 232 and hard mask layer 240. The second etching process is performed on the ESL layer 232 and hard mask layer 240 until a top portion of the S/D regions 230 and a top portion of the gate structure 220 (e.g., gate layer 238) is reached and/or exposed as illustrated in FIG. 2M. The removed portions of ILD layers 234, 244 and ESL 232/hard mask layer 240 form second contact openings and/or trenches 246B, 248B to the S/D regions 230 and gate structure 220. The second etching process has an etching selectivity between the ESL 232/hard mask layer 240 and the ILD layers 234, 244. For example, with the ESL 232/hard mask layer 240 comprising silicon nitride and the ILD layers 234, 244 comprising oxide, the second etching process may exhibit a high etching selectivity between silicon nitride and oxide, such that the second etching process removes ESL 232/hard mask layer 240 without substantially affecting the ILD layers 234, 244. In the present embodiment, the second etching process comprises a silicon nitride etching process.

The first and second etching processes may comprise one or more dry etching processes, wet etching processes, other suitable processes (e.g., reactive ion etching), and/or combinations thereof. The etching processes may be either purely chemical (plasma etching), purely physical (ion milling), and/or combinations thereof. For example, a dry etching process may be implemented in an etching chamber using process parameters including a radio frequency (RF) source power, a bias power, a pressure, a flow rate, a wafer temperature, other suitable process parameters, and/or combinations thereof. The dry etching process may implement an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. In some embodiments, the dry etching process utilizes an $O_2$ plasma treatment and/or an $O_2/N_2$ plasma treatment. Further, the dry etching process may be performed for any suitable time. A wet etching process may utilize a hydrofluoric acid (HF) solution for a HF dipping process. The HF solution may have any suitable concentration (e.g., 1:100). In some embodiments, a wet etching process may apply a diluted hydrofluoric acid to the semiconductor device 200. It is understood that the first and second etching processes may include multiple etching steps and etching solutions.

Referring to FIG. 2N, subsequently, contacts 250, 252 may be formed by any suitable process, including the processes described herein. Contacts 250 provide contact to the S/D regions 230 (via silicide regions), and contact 252 provides contact to the gate structure 220 (for example, coupled to a gate electrode of the gate structure 220). The contacts 250, 252 may be formed by filling second contact openings 246B, 248B with a conductive material. The conductive material may comprise aluminum, copper, tungsten, titanium, tantalum, titanium nitride, tantalum nitride, nickel silicide, cobalt silicide, TaC, TaSiN, TaCN, TiAl, TiAlN, other suitable materials, and/or combinations thereof. It is understood that the semiconductor device 200 may undergo further CMOS or MOS technology processing to form various features known in the art.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate structure over a substrate, wherein the gate structure includes a gate and the gate structure interposes a source region and a drain region disposed in the substrate;
   patterning a first etch stop layer such that the first etch stop layer is disposed on the source region and the drain region;
   patterning a second etch stop layer such that the second etch stop layer is disposed on the gate structure; and
   forming a source contact, a drain contact, and a gate contact, wherein the source contact and the drain contact extend through the first etch stop layer and the gate contact extends through the second etch stop layer, wherein the forming the source contact, the drain contact, and the gate contact includes simultaneously removing the first etch stop layer and the second etch stop layer to expose the gate, source region, and drain region.

2. The method of claim 1 wherein the patterning the first etch stop layer is performed after forming the gate structure.

3. The method of claim 2 wherein the forming the gate structure includes:
   forming a gate stack including a dummy gate over the substrate; and
   forming spacers along sidewalls of the gate stack.

4. The method of claim 3 further including replacing the dummy gate of the gate stack after patterning the first etch stop layer and before patterning the second etch stop layer.

5. The method of claim 1 further including:
   forming a first interlevel dielectric (ILD) layer over the first etch stop layer, wherein the patterning the first etch stop layer includes performing a chemical mechanical polishing process to remove the first etch stop layer from over the gate structure; and
   forming a second interlevel dielectric (ILD) layer over the second etch stop layer.

6. The method of claim 5 wherein the forming the source contact, the drain contact, and the gate contact further includes, before simultaneously removing the first etch stop layer and the second etch stop layer, simultaneously removing the first ILD layer and the second ILD layer to expose the first etch stop layer and the second etch stop layer.

7. The method of claim 6 wherein:
   simultaneously removing the first ILD layer and the second ILD layer includes selectively etching the first ILD layer and the second ILD layer; and
   simultaneously removing the first etch stop layer and the second etch stop layer includes selectively etching the first etch stop layer and the second etch stop layer.

8. The method of claim 7 wherein:
   the first ILD layer and the second ILD layer are oxide-containing layers; and
   the first etch stop layer and the second etch stop layer are nitride-containing layers.

9. The method of claim 1 wherein patterning the first etch stop layer does not form spacers of the gate structure.

10. A method comprising:
    forming a gate stack including a dummy gate over a substrate;
    forming spacers adjacent the gate stack;
    forming a source region and a drain region in the substrate, such that the gate stack interposes the source region and the drain region;
    patterning a first silicon nitride layer such that the dummy gate of the gate stack is exposed and the first silicon nitride layer is disposed on the source region and the drain region;
    replacing the exposed dummy gate of the gate stack with a metal gate, such that the gate stack includes the metal gate;
    patterning a second silicon nitride layer such that the second silicon nitride layer is disposed on the metal gate of the gate stack; and
    simultaneously etching the first silicon nitride layer and the second silicon nitride layer to form contact openings to the metal gate of the gate stack, the source region, and the drain region.

11. The method of claim 10 further including filling the contact openings with a conductive material, thereby forming contacts to the metal gate of the gate stack, the source region, and the drain region.

12. The method of claim 10 wherein the patterned first silicon nitride layer is disposed over the spacers.

13. The method of claim 10 wherein the patterning the first silicon nitride layer such that the first silicon nitride layer is disposed over the source region and the drain region includes:
    depositing a silicon nitride material over the substrate, wherein the silicon nitride layer is disposed over the gate stack, spacers, source region, and drain region; and
    performing a chemical mechanical polishing (CMP) process to remove the silicon nitride material from over the dummy gate of the gate stack.

14. The method of claim 13 further including forming an interlevel dielectric (ILD) layer over the silicon nitride material, wherein the CMP process further removes a portion of the ILD layer.

15. The method of claim 10 wherein the patterning the second silicon nitride layer such that the second silicon nitride layer is disposed on the metal gate of the gate stack includes:
    depositing a silicon nitride material over the substrate, wherein the silicon nitride layer is disposed over the gate stack, spacers, source region, and drain region; and
    performing an etching process to remove the silicon nitride material from over the source region and the drain region.

* * * * *